US012347488B1

(12) United States Patent
Rom-Saksonov

(10) Patent No.: US 12,347,488 B1
(45) Date of Patent: Jul. 1, 2025

(54) CONTENT ADDRESSABLE MEMORY WITH MULTI-ITERATION LOOKUP

(71) Applicant: Amazon Technologies, Inc., Seattle, WA (US)

(72) Inventor: Anna Rom-Saksonov, Rosh Haayin (IL)

(73) Assignee: Amazon Technologies, Inc., Seattle, WA (US)

( * ) Notice: Subject to any disclaimer, the term of this patent is extended or adjusted under 35 U.S.C. 154(b) by 189 days.

(21) Appl. No.: 18/097,710

(22) Filed: Jan. 17, 2023

(51) Int. Cl.
*G11C 15/04* (2006.01)

(52) U.S. Cl.
CPC .................... *G11C 15/04* (2013.01)

(58) Field of Classification Search
CPC ..................................... G11C 15/04
USPC ........................................ 365/49.1
See application file for complete search history.

(56) References Cited

U.S. PATENT DOCUMENTS

| 10,254,968 B1* | 4/2019 | Gazit .................... G06F 3/0611 |
| 2006/0026380 A1* | 2/2006 | Doi ...................... G06F 12/1027 |
| | | 711/207 |
| 2022/0197738 A1* | 6/2022 | Nelson ................... G11C 29/52 |

* cited by examiner

*Primary Examiner* — Huan Hoang
(74) *Attorney, Agent, or Firm* — Klarquist Sparkman, LLP

(57) ABSTRACT

A Content-Addressable Memory (CAM) is disclosed in which a single lookup request is split into several iterations, with each iteration having a partial lookup. Results of the partial lookups are incrementally accumulated to obtain a final lookup result. The incremental CAM lookup allows for smaller CAM hardware to be used than typically needed for a similar size lookup, which saves area and power over prior approaches. In one embodiment, a memory is used in conjunction with a CAM and the CAM is configured on each partial lookup using a read from the memory. Accumulation logic can then be used to logically combine the results of the partial lookups.

19 Claims, 6 Drawing Sheets

SOFTWARE 680 IMPLEMENTING DESCRIBED TECHNOLOGIES

CONTENT ADDRESSABLE MEMORY WITH MULTI-ITERATION LOOKUP

BACKGROUND

A Content-addressable memory (CAM) is a type of computer memory that compares an input search against a table of stored data and returns an address of matching data. One application of a CAM is in networking devices where a forwarding information base and routing table operations can be performed with high speed. Generally, a CAM operates by receiving an external search argument and comparing that argument with part or all of the information stored in the CAM. There are a variety of types of CAM, such as a flip-flop-based CAM and a ternary CAM (TCAM). In either case, each bit in a fully parallel CAM has its own associated comparison logic, which increases the physical size and overall cost of the CAM. As a result, CAMs typically require a lot of area and power.

DETAILED DESCRIPTION

A Content-Addressable Memory (CAM) is disclosed in which a single lookup request is split into several iterations, with each iteration having a partial lookup. Results of the partial lookups are incrementally accumulated to obtain a final lookup result. The incremental CAM lookup allows for smaller CAM hardware to be used than typically needed for a similar size lookup, which saves area and power over prior approaches. In one embodiment, a memory is used in conjunction with a CAM and the CAM is configured on each partial lookup using a read from the memory. Accumulation logic can then be used to logically combine the results of the partial lookups. The use of multiple configurations of the CAM requires additional clock iterations, but, in certain applications, power savings outweigh the increased latency.

Figure 1:
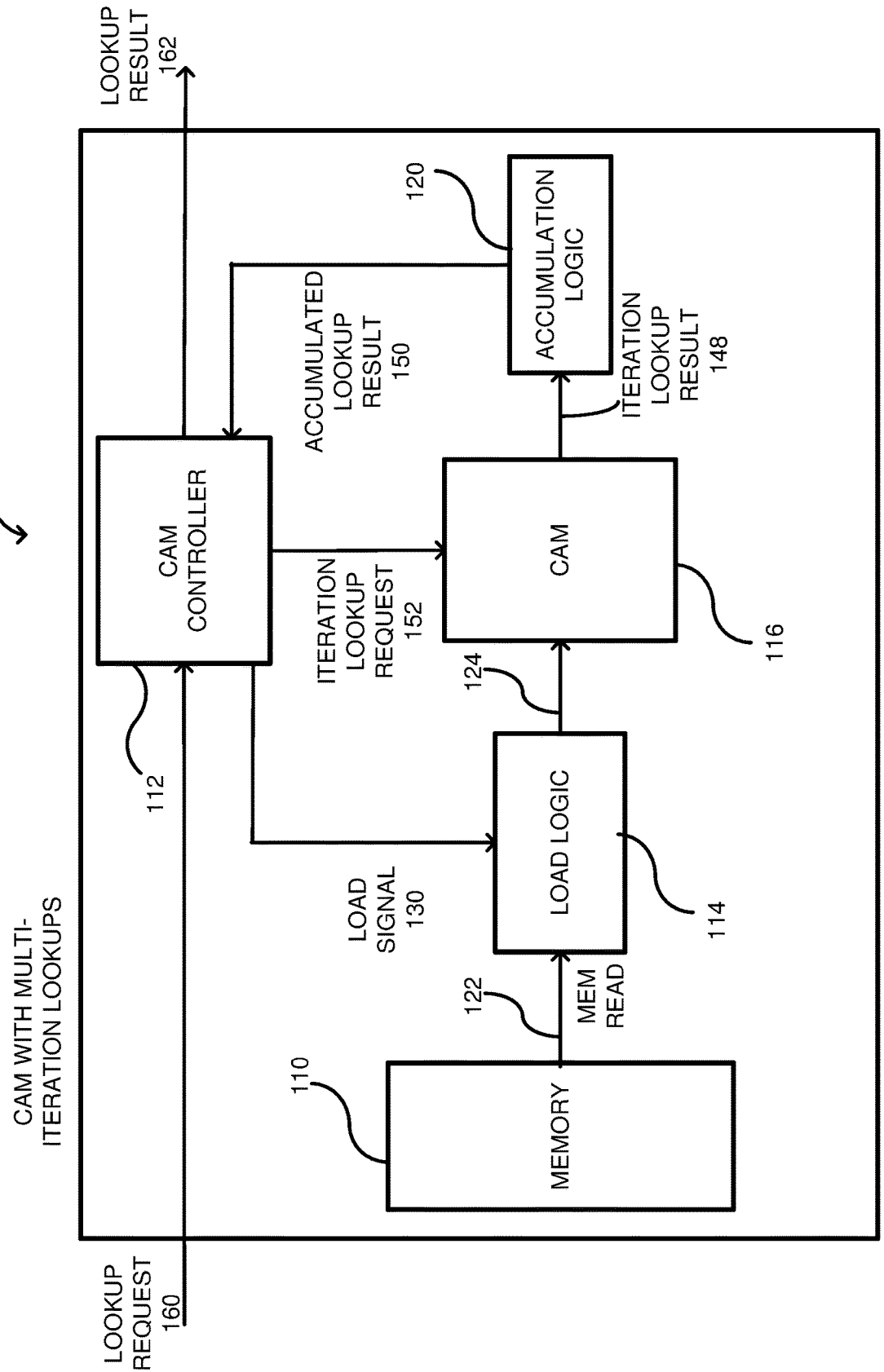
FIG. 1 is a first embodiment of a content-addressable memory (CAM) with multiple iterations per lookup.

FIG. 1 is an example of a multiple-iteration CAM 100. The multiple-iteration CAM 100 includes a memory 110, a CAM controller 112, load logic 114, a CAM 116, and accumulation logic 120. The memory 110 can be a volatile memory (e.g., registers, cache, RAM), non-volatile memory (e.g., ROM, EEPROM, flash memory, etc.), or a combination thereof. The load logic 114 includes hardware for setting up an address on an address bus to the memory 110, activating a read line, and reading contents of the memory 110, all of which are represented at 122. The load logic 114 can correspondingly write the contents to the CAM 116 to configure the CAM 116 during a current iteration over a bus 124. The reading of the memory 110 and the writing of CAM 116 is in response to a load signal 130 received from the CAM controller 112. The CAM controller 112 can also provide an address to the load logic 114 that is a starting address for a block of data to be read. The block of data can be sized such that it is equal to the size of the CAM 116. The CAM 116 is shown generically, but any type of CAM can be used, such as a ternary CAM or a flip-flop-based CAM. Additionally, the CAM can be a single-match CAM that terminates on finding a match or multi-match CAM that outputs results for all matches and iterates over an entire memory. Generally, the size of the memory 110 is larger than the size of the CAM 116 so that the memory can store a plurality of memory blocks and each memory block is equal to the size of the CAM 116. The CAM 116 is configured multiple times during a lookup using the memory blocks and each time, the results 148 of the lookup are read by the accumulation logic 120, which logically combines the results and provides an accumulated lookup result 150 to the CAM controller 112. Thus, in response to a lookup request 160, the CAM controller 112 can perform a multiple-iteration CAM lookup using lookup request signal 152 and, based upon the accumulated lookup result, the CAM controller 112 can provide a final lookup result 162. The lookup request 160 can include data to be matched upon. The advantage of the CAM 100 is that the internal CAM 116 is chosen to be smaller than what would normally be used for the lookup request 160, which saves power and area, while a more efficient memory 110, which uses less power, can be used to configure the CAM 116 on multiple iterations.

Figure 2:
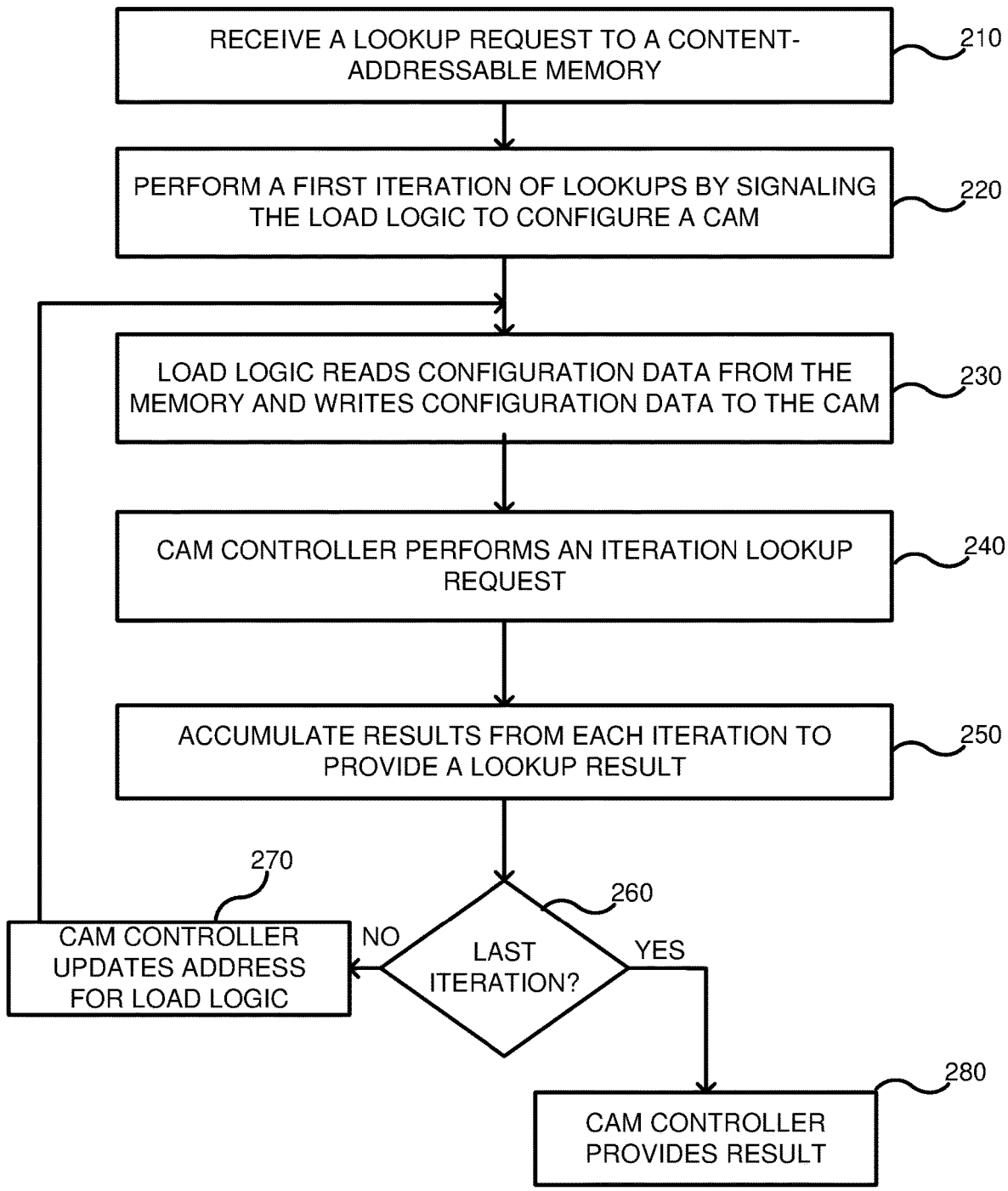
FIG. 2 is a flowchart for performing a lookup of the CAM of FIG. 1.

FIG. 2 shows a method using the embodiment of FIG. 1. In process block 210, a lookup request is received at a content addressable memory. For example, in FIG. 1, the lookup request 160 is received in the CAM 100. In process block 220, a first iteration of lookups is performed by signaling the load logic to configure the CAM. For example, in FIG. 1, the load logic 114 receives the load signal 130. In process block 230, the load logic reads configuration data (i.e., a portion of the memory contents) from the memory and writes the configuration data to the CAM. For example, in FIG. 1, the load logic 114 reads the memory 110 using an address provided by the CAM controller 112 and then loads the data read into the CAM 116. In process block 240, the CAM controller performs an iteration lookup request. For example, in FIG. 1, the CAM controller 112 can perform an iteration lookup request 152. In process block 250, the results from each iteration are accumulated to provide a lookup result. For example, in FIG. 1, the accumulation logic 120 can logically combine the results of each iteration, such as by performing a Boolean operation (e.g., an AND function). In decision block 260, a determination is made whether this is the final iteration needed. For example, if the accumulation logic 120 finds a match, then there is no need to iterate over the rest of the contents of the memory 110 in a single-match implementation. Thus, in process block 280, the CAM controller can provide a result and the iterations are terminated. In multi-match implementations, the CAM controller iterates over the entire memory to detect multiple matches. In decision block 260, if the accumulation logic 120 has completed the last iteration, then the result 150 is the final result. The CAM controller 112 can therefore output the lookup result 162. If there are more iterations to complete, then in process block 270, the CAM controller updates the address for the load logic to allow for loading another portion of data from the memory 110 into the CAM 116 for the next iteration and the process blocks starting at 230 are repeated. For example, the load logic 114 can receive the updated address to read from the memory 110 for the next iteration. Generally, there are two or more iterations, but can be three or more iterations.

Figure 3:
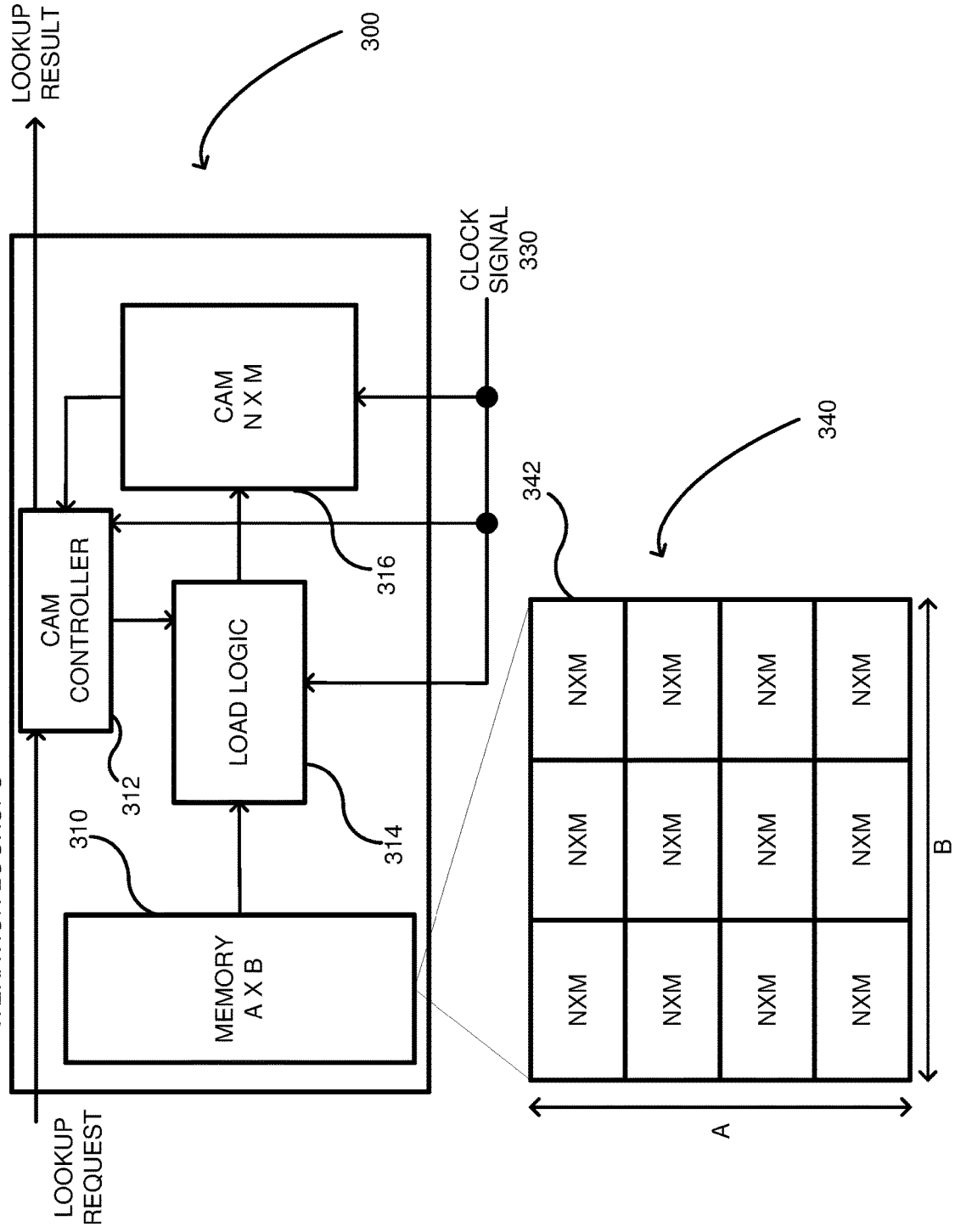
FIG. 3 is a second embodiment of a CAM with multiple iterations per lookup.

FIG. 3 shows another embodiment of a CAM 300 with multi-iteration lookups. In this embodiment, the CAM 300 includes an A×B sized memory 310, a CAM controller 312, load logic 314 and an N×M CAM 316. Notably, the accumulation logic 120 of FIG. 1 is not present, as similar functionality can be included in the CAM controller 312. Consequently, the CAM 316 is directly coupled to the CAM controller 312. A clock signal 330 is included in FIG. 3 and can be similarly added to FIG. 1. The memory 310 is shown as being sized larger than the CAM 316. As shown at 340, the memory 310 can be divided into blocks (e.g., block 342) with each block being a size of the CAM 316. Thus, a maximum of 12 iterations are needed to search to account for each N×M block in the memory 310. On each iteration, one of the blocks is loaded into the CAM 316, and on a subsequent iteration a next block is loaded into the CAM 316 and so on, until all of the blocks have been loaded into the CAM 316 (in single-match implementations, when a match is found, the search can terminate).

The lookup flow can be as follows:

A lookup request is received with lookup_tag[B−1:0]

For each iteration i, out of a total Z iterations, the following is performed:
Perform W iterations, such that for each iteration j, out of total W iterations, perform the following:
read from the memory 310, N values of M-bits, starting at value i×j×(N×M).
write these N values into the physical CAM 316.
send to the CAM 316, a lookup request with lookup_tag[(j+1)×M−1 (j×M)]
process the lookup result by the accumulation logic (located in the CAM controller 312).

Send out the final lookup result, which is basically the accumulated lookup result of the last iteration (iteration K, where K=(Z)(W)).

As described above, each iteration performs a lookup inside a different set of N values of M-bits, out of total K such sets. In the example of FIG. 3, Z=4 and W=3.

Figure 4:
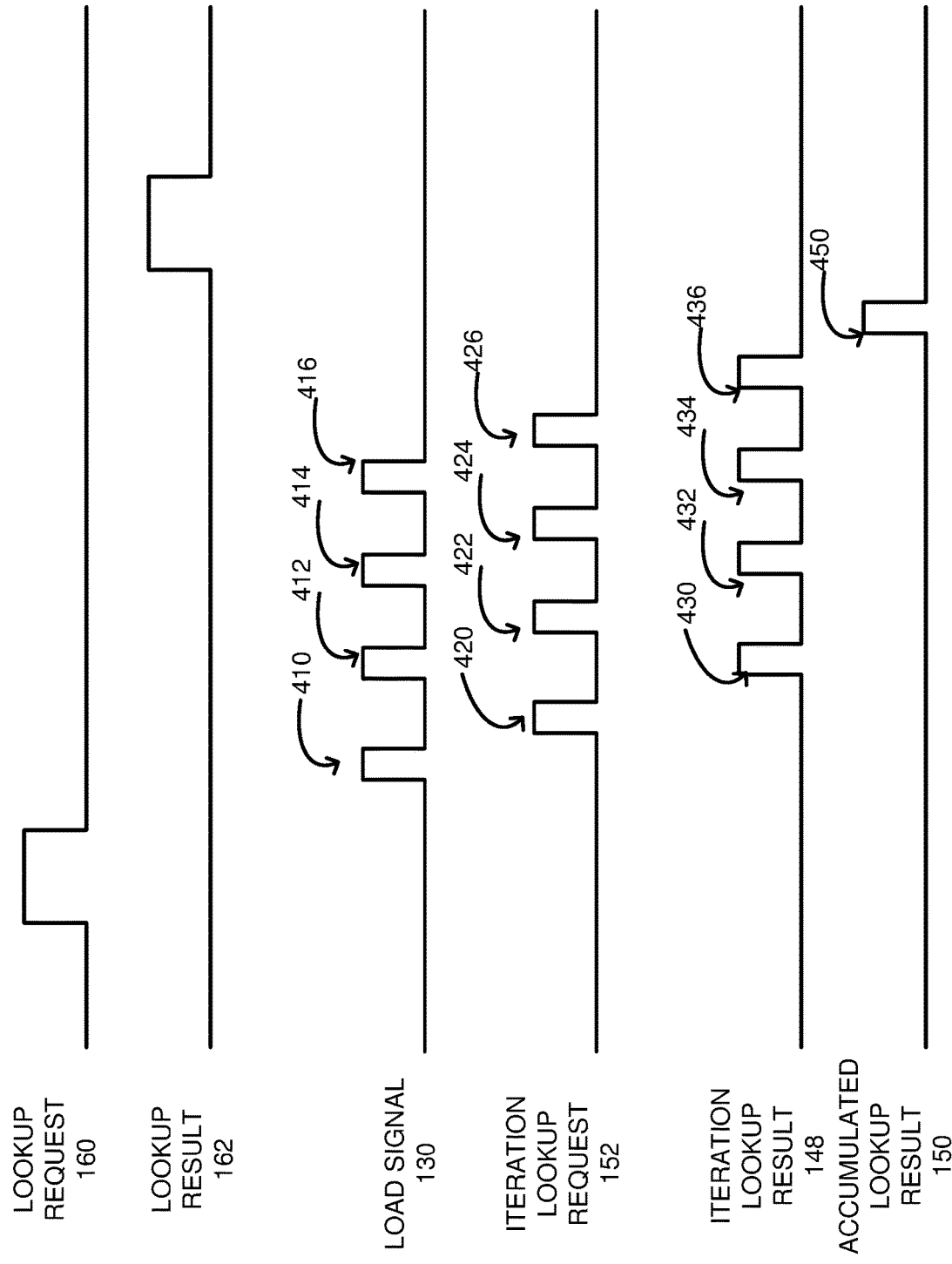
FIG. 4 is a timing diagram that can be used in either the first or second embodiments of FIGS. 1 and 2.

The accumulation logic within the CAM controller 312 can perform the following:

For each W inner iteration, a logical AND operation between all the results of these iterations is performed. For each Z outer iteration, the lookup results are stored in a side vector of A bits. The final lookup result can be a multi-hit vector of A-bits, such as result_vector[A−1:0], stating for each value out of A B-bits values, whether there was a match with the lookup_tag[B−1:0]. If the lookup result should be only the first value that got hit, then priority encoding is performed on the result_vector[A−1:0] to get the index of the first bit set. It should be noted that the CAM (with dimensions N×M) can be a multiple-match CAM, i.e., the CAM outputs the results of all matches, allowing the accumulation logic to operate. FIG. 4 is a timing diagram that can be used with the signals of FIG. 1 but can be equally applied to FIG. 3. The timing initiates with the lookup request 160 being activated. Although not shown, the lookup request includes data for which the CAM 100 searches. In response to the activated lookup request, the CAM controller 112 activates the first load signal 130, as shown at 410. Subsequent activations are shown at 412, 414, and 416. Each activation of the load signal 130 represents an iteration of the multi-iteration lookup. The first load signal 410 results in data being moved from the memory 110 to the CAM 116 to configure the CAM 116. After each load signal, the iteration lookup request signal 152, shown sequentially at 420, 422, 424 and 426, is activated, which results in the CAM 116 performing a compare of data (which is part of the iteration lookup request) and the data stored in the CAM 116. The iteration lookup results 430, 432, 434 and 436 can be available to the accumulation logic, which logically combines the results to provide the accumulated lookup result 150, as shown at 450. The CAM controller can then issue the lookup result 162.

Figure 5:
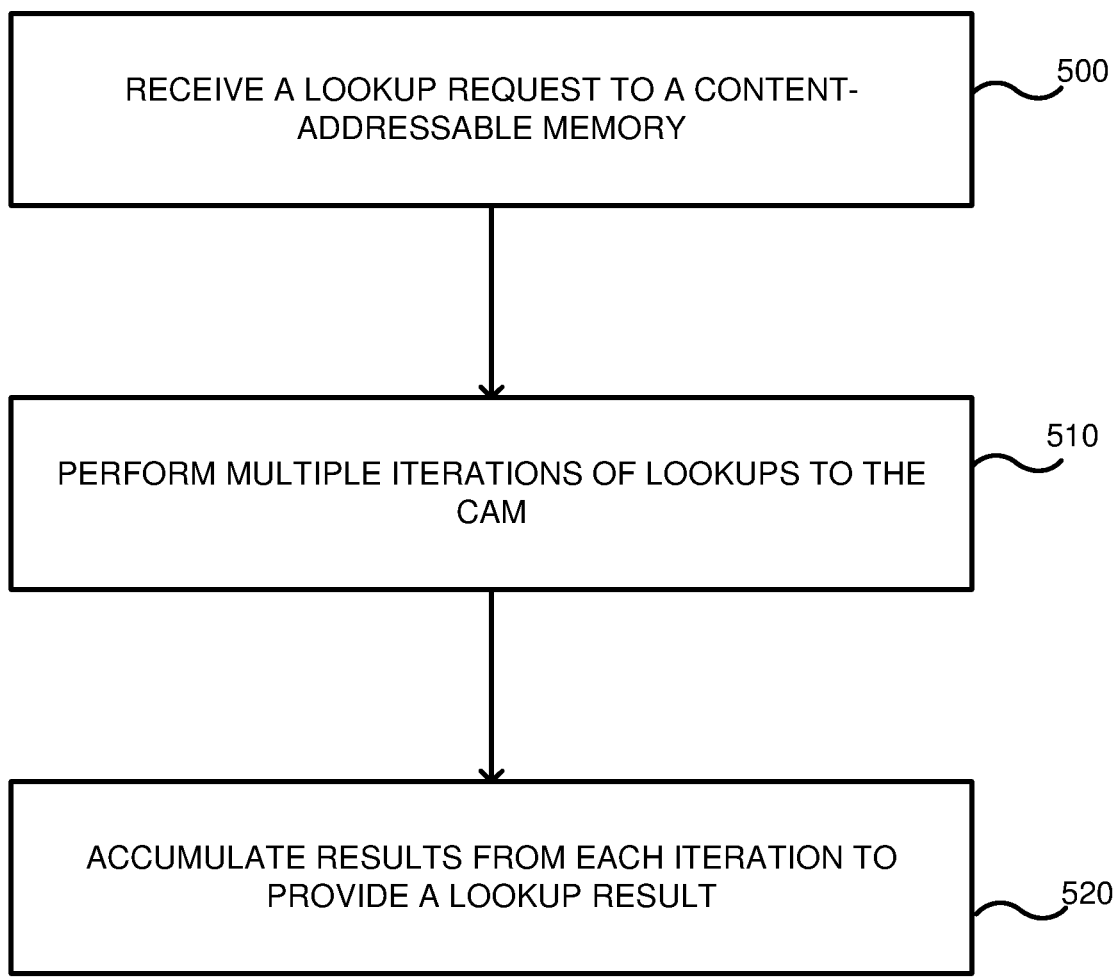
FIG. 5 is a flowchart according to a method for performing a multi-iteration CAM lookup.

FIG. 5 is a flowchart of a method according to another embodiment. In process block 500, a lookup request is received in a CAM. For example, in FIG. 1, a lookup request 160 is received in the CAM 100. In process block 510, multiple iterations of lookups are performed. For example, in FIG. 1, the CAM controller 112 can issue two or more sequential iteration lookup requests 152 to the CAM 116 in response to the single lookup request 160. The two or more sequential iterations require the load logic 114 to configure the CAM 116 prior to each lookup request 152. In process block 520, the results of each iteration are accumulated to provide a lookup result. For example, in FIG. 1, the accumulation logic 120 can logically combine the iteration lookup results 148 from each iteration to provide an accumulated lookup result 150. The CAM controller 112 can then provide the final lookup result 162.

Figure 6:
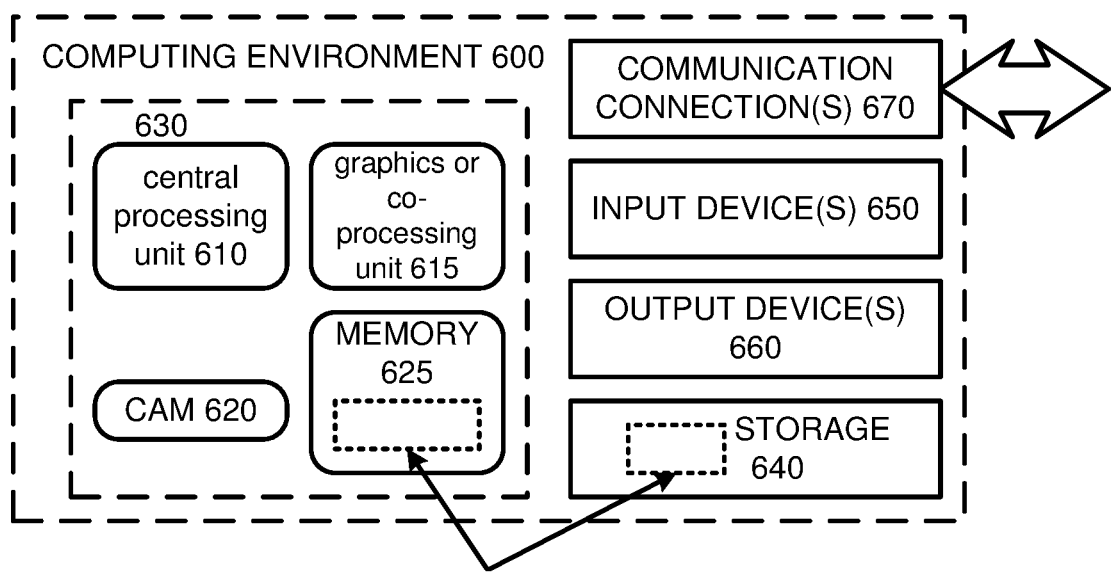
FIG. 6 depicts a generalized example of a suitable computing environment in which the described innovations may be implemented.

FIG. 6 depicts a generalized example of a suitable computing environment 600 in which the described innovations may be implemented. The computing environment 600 is not intended to suggest any limitation as to scope of use or functionality, as the innovations may be implemented in diverse general-purpose or special-purpose computing systems. For example, the computing environment 600 can be any of a variety of computing devices (e.g., desktop computer, laptop computer, server computer, tablet computer, etc.).

With reference to FIG. 6, the computing environment 600 includes one or more processing units 610, 615, memory 625 and a CAM 620, which can be the CAM 100 of FIG. 1 or the CAM 300 of FIG. 3. In FIG. 6, this basic configuration 630 is included within a dashed line. The processing units 610, 615 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 6 shows a central processing unit 610 as well as a graphics processing unit or co-processing unit 615. The tangible memory 625 may be volatile memory (e.g., registers, cache, RAM), non-volatile memory (e.g., ROM, EEPROM, flash memory, etc.), or some combination of the two, accessible by the processing unit(s). The memory 625 stores software 680 implementing one or more innovations described herein, in the form of computer-executable instructions suitable for execution by the processing unit(s).

A computing system may have additional features. For example, the computing environment 600 includes storage 640, one or more input devices 650, one or more output devices 660, and one or more communication connections 670. An interconnection mechanism (not shown) such as a bus, controller, or network interconnects the components of the computing environment 600. Typically, operating system software (not shown) provides an operating environment for other software executing in the computing environment 600, and coordinates activities of the components of the computing environment 600.

The tangible storage 640 may be removable or non-removable, and includes magnetic disks, magnetic tapes or cassettes, CD-ROMs, DVDs, or any other medium which can be used to store information in a non-transitory way and which can be accessed within the computing environment 600. The storage 640 stores instructions for the software 680 implementing one or more innovations described herein.

The input device(s) 650 may be a touch input device such as a keyboard, mouse, pen, or trackball, a voice input device, a scanning device, or another device that provides input to the computing environment 600. The output device(s) 660 may be a display, printer, speaker, CD-writer, or another device that provides output from the computing environment 600.

The communication connection(s) 670 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, aspects of the disclosed technology can be implemented by software written in C++, Java, Perl, any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention. We therefore claim as our invention all that comes within the scope of these claims.

What is claimed is:

1. A Content-Addressable Memory (CAM) system, comprising:
   a memory;
   a Content-Addressable Memory (CAM) coupled to the memory;
   load logic coupled between the memory and the CAM for moving contents from the memory to configure the CAM;
   a controller coupled to the load logic and the CAM for configuring the CAM in response to a lookup request and for controlling multiple iterations of CAM lookups to satisfy the lookup request; and
   accumulation logic coupled to an output of the CAM for logically combining the multiple iterations of CAM lookups.

2. The system of claim 1, wherein the accumulation logic is integrated into the controller.

3. The system of claim 1, wherein the CAM has less storage than the memory.

4. The system of claim 1, wherein the memory is a random access memory.

5. The system of claim 1, wherein the load logic is configured to supply an address and a read signal to the memory.

6. A method, comprising:
   receiving a lookup request to a content-addressable memory (CAM);
   based upon the lookup request, performing multiple iterations of lookups to the CAM, wherein the CAM is configured prior to each of the multiple iterations using contents from a memory, which includes a random access memory (RAM) coupled to the CAM; and accumulating results in accumulation logic coupled to an output of the CAM, wherein the accumulation logic combines outputs from the CAM on multiple sequential lookups.

7. The method of claim 6, wherein the lookup request is received by a CAM controller that configures the CAM before every iteration by controlling reading of the memory to load the CAM.

8. The method of claim 6, wherein the memory is a Random Access Memory (RAM) that is sized larger than the CAM.

9. The method of claim 6, wherein the accumulating of the results includes logically combining the results.

10. The method of claim 6, further comprising terminating the multiple iterations if a match is found during one of the multiple iterations.

11. The method of claim 6, wherein the lookup request includes data that is compared to data in the CAM to determine whether there is a match.

12. The method of claim 6, wherein the accumulating of the results occurs within a CAM controller.

13. The method of claim 6, wherein the accumulating of the results occurs in accumulation logic coupled to a CAM controller.

14. The method of claim 6, further comprising, in a multi-match implementation, continuing to perform the lookups until an entirety of the memory is searched.

15. A system, comprising:

a content-addressable memory (CAM);

a random access memory (RAM) coupled to the CAM;

a CAM controller coupled to the CAM and the RAM for configuring the CAM using contents of the RAM and for writing the CAM in multiple iterations in response to a lookup request; and accumulation logic coupled to an output of the CAM, wherein the accumulation logic is configured to logically combine outputs of the CAM on multiple sequential lookups.

16. The system of claim 15, wherein the CAM is a smaller memory size than the RAM.

17. The system of claim 15, further including load logic between the RAM and the CAM, wherein the load logic is configured to move contents of the RAM into the CAM in response to a request from the CAM controller.

18. The system of claim 15, wherein the CAM controller is configured to terminate the multiple iterations in response to a match between contents in the CAM and data associated with the lookup request in a single-match implementation and to continue all possible iterations in a multi-match implementation.

19. The system of claim 15, wherein the CAM controller provides a lookup result that is a combination of the multiple iterations of lookups of the CAM.

\* \* \* \* \*